United States Patent
Higuchi et al.

(10) Patent No.: US 11,935,736 B2
(45) Date of Patent: Mar. 19, 2024

(54) SUBSTRATE PROCESSING METHOD AND SUBSTRATE PROCESSING APPARATUS

(71) Applicant: TOKYO ELECTRON LIMITED, Tokyo (JP)

(72) Inventors: Rintaro Higuchi, Koshi (JP); Tsunemoto Ogata, Koshi (JP); Mitsunori Nakamori, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 422 days.

(21) Appl. No.: 17/266,672

(22) PCT Filed: Aug. 9, 2019

(86) PCT No.: PCT/JP2019/031577
§ 371 (c)(1),
(2) Date: Feb. 8, 2021

(87) PCT Pub. No.: WO2020/039974
PCT Pub. Date: Feb. 27, 2020

(65) Prior Publication Data
US 2021/0313171 A1    Oct. 7, 2021

(30) Foreign Application Priority Data

Aug. 21, 2018  (JP) .................................. 2018-154985

(51) Int. Cl.
*H01L 21/02* (2006.01)
*B08B 3/02* (2006.01)
(Continued)

(52) U.S. Cl.
CPC ........ *H01L 21/02057* (2013.01); *B08B 3/022* (2013.01); *B08B 7/0014* (2013.01);
(Continued)

(58) Field of Classification Search
None
See application file for complete search history.

(56) References Cited

U.S. PATENT DOCUMENTS

| | | | | |
|---|---|---|---|---|
| 2016/0071747 A1* | 3/2016 | Uozumi | ............ | H01L 21/67098 156/345.15 |
| 2017/0365487 A1* | 12/2017 | Shen | ................. | H01L 21/30604 |
| 2020/0135503 A1* | 4/2020 | Sasaki | ............... | H01L 21/67248 |

FOREIGN PATENT DOCUMENTS

| | | |
|---|---|---|
| JP | 2015-92619 A | 5/2015 |
| JP | 2018-56176 A | 4/2018 |
| KR | 20120106650 | * 9/2012 |

OTHER PUBLICATIONS

Translation of KR20120106650 by Kakimoto, dated Sep. 26, 2012.*

* cited by examiner

*Primary Examiner* — Mikhail Kornakov
*Assistant Examiner* — Ryan L Coleman
(74) *Attorney, Agent, or Firm* — Nath, Goldberg & Meyer; Jerald L. Meyer; Tanya E. Harkins

(57) ABSTRACT

A substrate processing method for removing liquid on a substrate having an uneven pattern formed on a surface of the substrate and drying the substrate. The substrate processing method includes: forming a laminate having a two-layer structure including a first material in a solid state forming a lower layer and a second material in a solid state forming an upper layer, in a concave portion of the pattern; removing the second material from the concave portion by performing at least one of a heating process, a light-emitting process, and a reaction process using gas with respect to the second material to sublimate, decompose, and gas-react the second material; and removing the first material from the concave portion by performing at least one of the heating process, the light-emitting process, and the reaction process (Continued)

using gas with respect to the first material to sublimate, decompose, and gas-react the first material.

13 Claims, 12 Drawing Sheets

(51) Int. Cl.
*B08B 7/00* (2006.01)
*B08B 7/04* (2006.01)
*F26B 3/02* (2006.01)
*F26B 3/28* (2006.01)
*H01L 21/67* (2006.01)
*H01L 21/687* (2006.01)

(52) U.S. Cl.
CPC .............. *B08B 7/0057* (2013.01); *B08B 7/04* (2013.01); *F26B 3/02* (2013.01); *F26B 3/28* (2013.01); *H01L 21/67051* (2013.01); *H01L 21/68764* (2013.01)

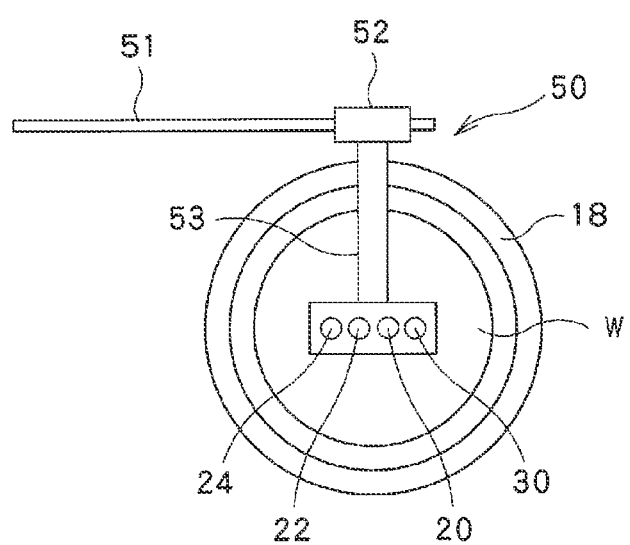

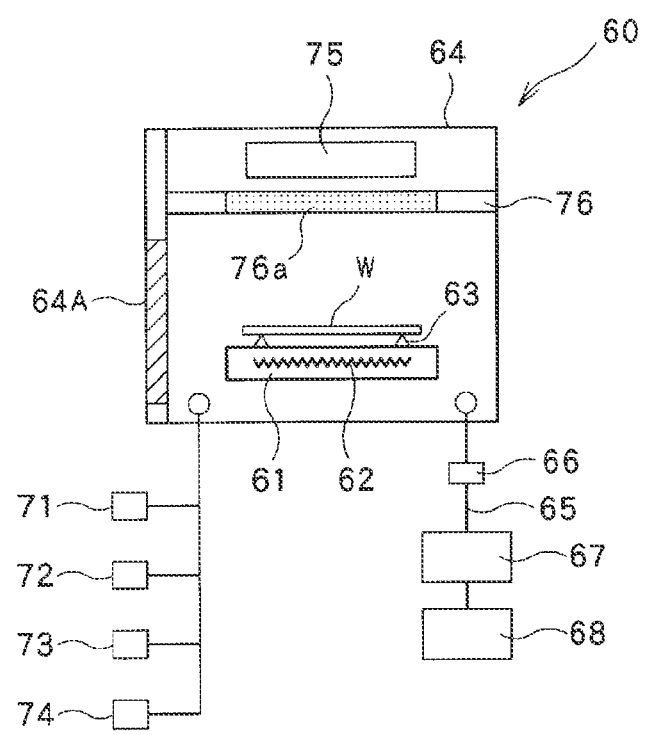

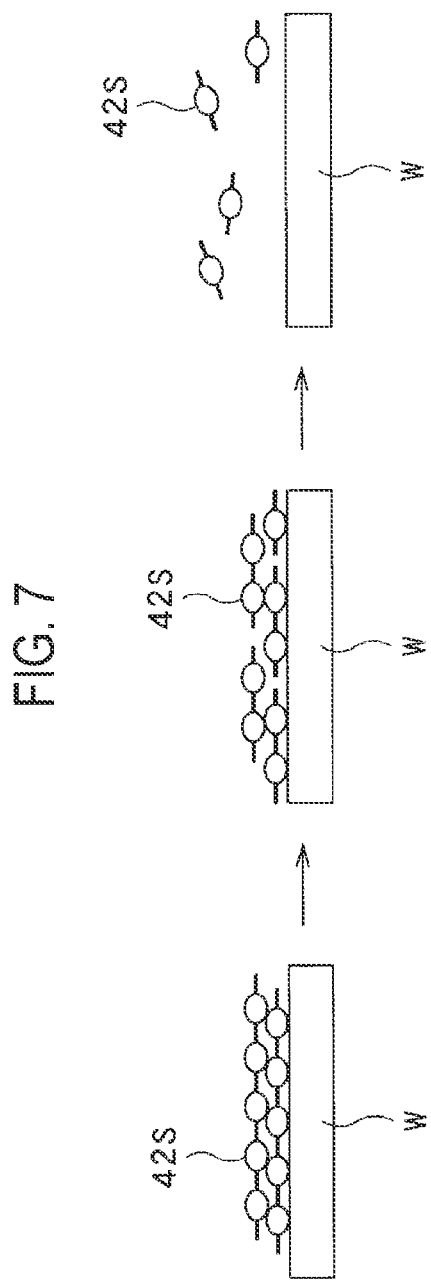

FIG. 10

| Lower layer (1st material) | Upper layer (2nd material) | | | | |
|---|---|---|---|---|---|
| | Sublimation | Thermal decomposition | Photodecomposition | Acid or alkali gas decomposition | Ozone decomposition |
| Sublimation (anthracene, adamantane, camphor) | × | × | × | × | × |
| Thermal decomposition (polymethacrylate, polystyrene, polyperoxide) | 1 | 2 | 3 | 4 | 5 |
| Photodecomposition (polyketone, polyolefin sulfone) | 6 | 7 | (8) | 9 | 10 |
| Acid or alkali gas decomposition (polyester, nylon, polyazomethine) | 11 | 12 | 13 | 14 | 15 |
| Ozone decomposition (vinyl polymer, polymer resist) | 16 | 17 | 18 | 19 | (20) |

SUBSTRATE PROCESSING METHOD AND SUBSTRATE PROCESSING APPARATUS

This is a National Phase Application filed under 35 U.S.C. 371 as a national stage of PCT/JP2019/031577, filed Aug. 9, 2019, an application claiming the benefit of Japanese Application No. 2018-154985, filed Aug. 21, 2018, the content of each of which is hereby incorporated by reference in its entirety.

TECHNICAL FIELD

The present disclosure relates to a substrate processing method and a substrate processing apparatus.

BACKGROUND

Patent Document 1 discloses a substrate processing method, in which, in a substrate drying process, a solution of a sublimable substance is supplied to the surface of a substrate so as to fill a concave portion in a pattern of the substrate with the solution, then the sublimable substance is dried so as to fill the concave portion with the sublimable substance in a solid state, and then the substrate is heated so as to sublimate and remove the sublimable substance.

According to Patent Document 1, since the concave portion of the pattern is filled with the sublimable substance in the solid state and then the sublimable substance is sublimated and removed, it is possible to remove the sublimable substance without passing through the liquid phase of the sublimable substance. Thus, it is possible to prevent the pattern of the substrate from collapsing.

PRIOR ART DOCUMENT

Patent Document

Patent Document 1: Japanese Laid-Open Patent Publication No. 2015-092619

SUMMARY

The present disclosure provides a substrate processing technique capable of reliably preventing pattern collapse in a substrate drying process.

According to an embodiment of the present disclosure, in a substrate processing method for removing liquid on a substrate having an uneven pattern formed on a surface of the substrate and drying the substrate, the substrate processing method includes: forming a laminate having a two-layer structure including a first material in a solid state forming a lower layer and a second material in a solid state forming an upper layer, in a concave portion of the pattern; removing the second material from the concave portion by performing at least one of a heating process, a light-emitting process, and a reaction process using a first gas with respect to the second material to sublimate, decompose, and gas-react the second material; and removing the first material from the concave portion by performing at least one of the heating process, the light-emitting process, and a reaction process using a second gas with respect to the first material to sublimate, decompose, and gas-react the first material.

According to the embodiment of the present disclosure, it is possible to reliably prevent pattern collapse in a substrate drying process.

BRIEF DESCRIPTION OF DRAWINGS

FIG. 3 is a schematic plan view of the liquid processing unit of FIG. 2.

FIG. 4 is a schematic view illustrating a configuration of a material removal unit installed in the substrate processing apparatus of FIG. 1.

FIG. 7 is a schematic view illustrating how a decomposable polymer material in a solid state is decomposed.

FIG. 10 is a chart showing combination modes in specific examples according to the present embodiment.

DETAILED DESCRIPTION

Hereinafter, embodiments will be described with reference to the accompanying drawings. First, a substrate processing apparatus for carrying out a substrate processing method for drying a substrate after liquid processing will be described. The substrate processing method is preferably carried out as a series of processes in combination with a previous step. Here, a substrate processing method carried out as a series of processes in combination with a chemical cleaning step and a rinsing step as previous steps will be described.

Figure 1:
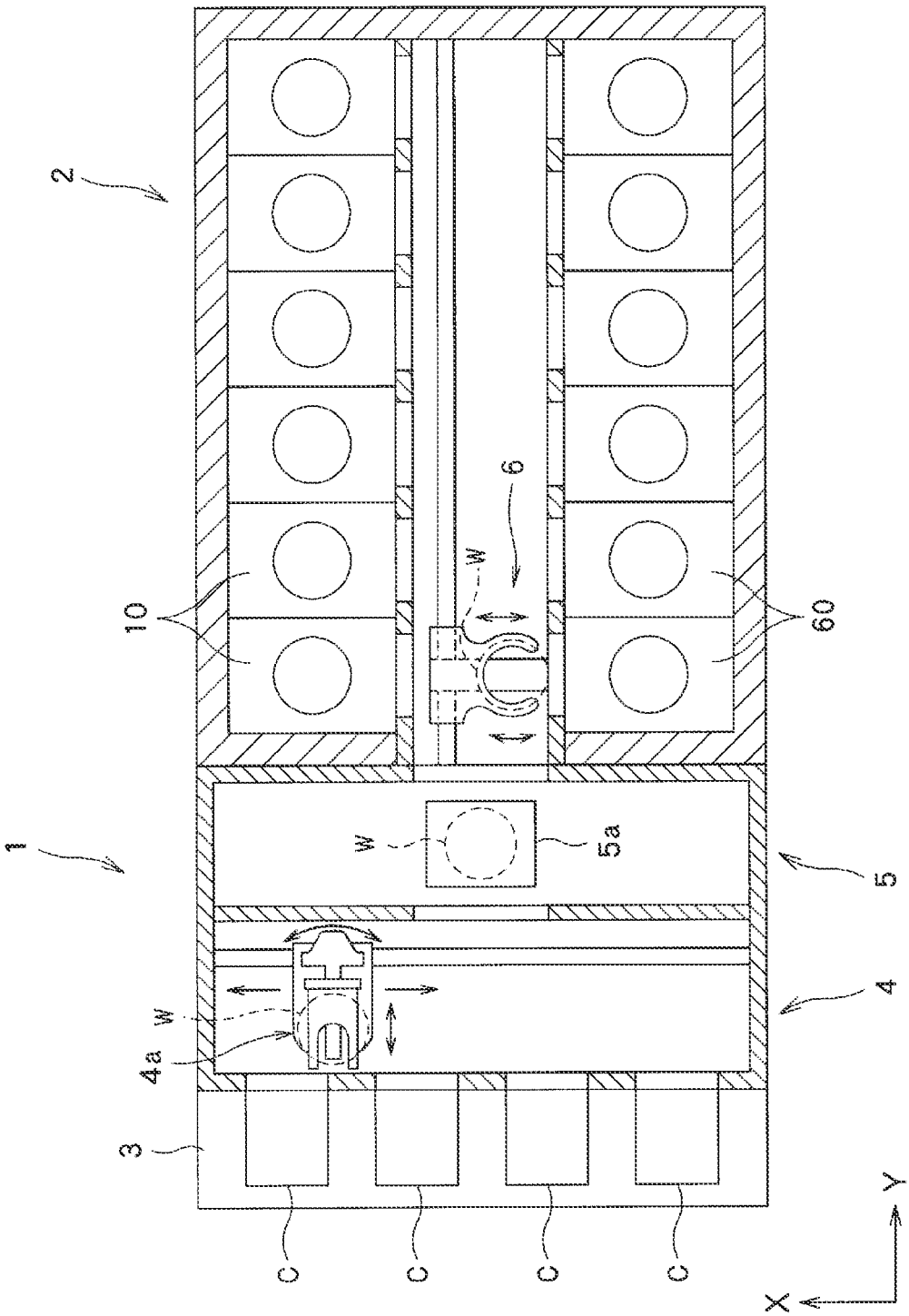
FIG. 1 is a schematic plan view illustrating an overall configuration of a substrate processing apparatus for carrying out a substrate processing method according to an embodiment of the present disclosure.

As illustrated in FIG. 1, this substrate processing apparatus is a cleaning apparatus including a substrate loading/unloading part 1 and a liquid processing part 2. The substrate loading/unloading part 1 has a carrier placement part 3, a transport part 4, and a delivery part 5. A carrier C accommodating substrates is placed on the carrier placement part 3, and a transport mechanism 4a installed in the transport part 4 carries the substrates out of the carrier C and transports the substrates to a delivery unit 5a installed in the delivery part 5. The liquid processing part 2 includes liquid processing units 10 configured to clean substrates, material removal units 60 configured to remove a first material and a second material from the substrates, and a substrate transport mechanism 6. The substrate transport mechanism 6 is capable of accessing the delivery unit 5a, the liquid processing units 10, and the material removal units 60, and carries a substrate into/out of each liquid processing unit 10 and each material removal unit 60. The first material and the second material are supplied to the substrates, and the first material and the second material will be described later.

Figure 2:
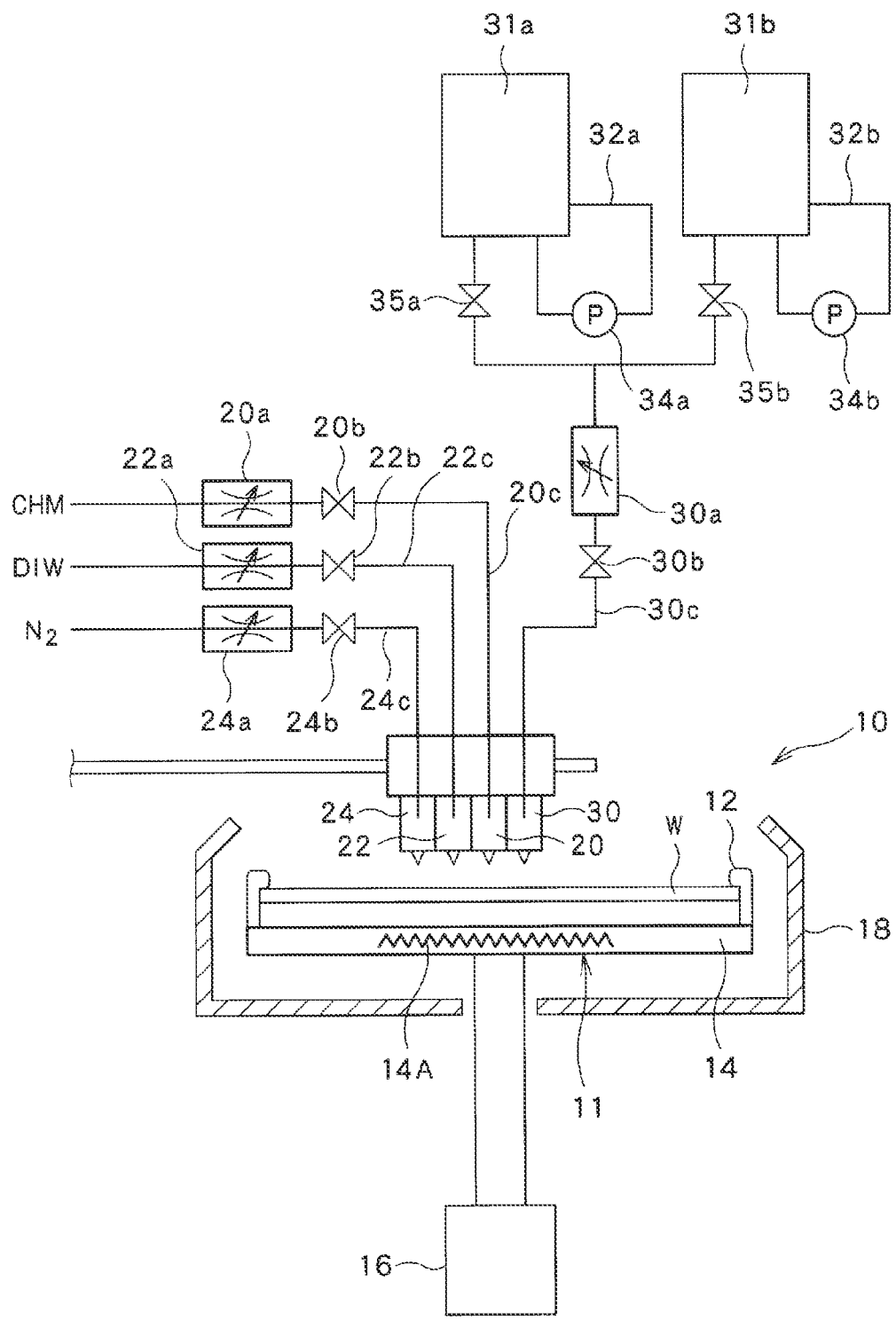
FIG. 2 is a schematic view illustrating a configuration of a liquid processing unit installed in the substrate processing apparatus of FIG. 1.

Next, a configuration of the liquid processing unit 10 will be described with reference to FIG. 2. The liquid processing unit 10 has a spin chuck 11 configured to rotate while holding a substrate (in this example, a semiconductor wafer W) substantially horizontally. The spin chuck 11 has a substrate holder 14 configured to hold a substrate in a horizontal posture by holding members 12 configured to hold the peripheral edge of a wafer W, and a rotary driver 16 configured to rotationally drive the substrate holder 14. Around the substrate holder 14, a cup 18 is installed to receive various processing liquids, such as a chemical liquid, a rinse solution, and a sublimable substance solution described later, that are scattered from the wafer W. The substrate holder 14 and the cup 18 are configured to be movable relative to each other in the vertical direction such that the wafer W can be delivered between the substrate transport mechanism 6 and the substrate holder 14 described above.

The liquid processing unit 10 includes a chemical liquid nozzle 20 configured to supply a chemical liquid (CHM) to the wafer W, a rinsing nozzle 22 configured to supply pure water (DIW) to the wafer W, and an $N_2$ gas nozzle 24 configured to supply $N_2$ gas to the wafer W. A chemical liquid is supplied to the chemical liquid nozzle 20 from a chemical liquid supply source through a chemical liquid pipeline 20*c*, in which appropriate flow rate regulators, such as a flow rate adjustment valve 20*a* and an opening/closing valve 20*b*, are interposed. DIW is supplied to the rinsing nozzle 22 from a DIW supply source through a DIW pipeline 22*c*, in which appropriate flow rate regulators, such as a flow rate adjustment valve 22*a* and an opening/closing valve 22*b*, are interposed. The $N_2$ gas is supplied to the $N_2$ gas nozzle 24 from an $N_2$ gas supply source through an $N_2$ gas pipeline 24*c*, in which appropriate flow rate regulators, such as a flow rate adjustment valve 24*a* and an opening/closing valve 24*b*, are interposed.

The liquid processing unit 10 further includes a material solution nozzle 30 configured to supply a solution of the first material or the second material to the wafer W. A solution of this material contains the first material or the second material and a solvent for the material. The solution of the first material is supplied to the material solution nozzle 30 from a tank 31*a*, as a material solution supply source, through a material solution pipeline 30*c*, in which appropriate flow rate regulators, such as a flow rate adjustment valve 30*a* and an opening/closing valve 30*b*, are interposed. The solution of the second material is further supplied to the material solution nozzle 30 from a tank 31*b*, as a material solution supply source, through the material solution pipeline 30*c*, in which the flow rate adjustment valve 30*a* and the opening/closing valve 30*b* are interposed. A circulation pipeline 32*a*, in which a pump 34*a* is interposed, is connected to the tank 31*a* configured to store the solution of the first material. In addition, a circulation pipeline 32*b*, in which a pump 34*b* is interposed, is connected to the tank 31*b* configured to store the solution of the second material. The saturation degrees of the solution of the first material and the solution of the second material are preferably set to values at which the first material and the second material do not precipitate before being supplied to the wafer W and at which precipitation occurs immediately after the start of the drying step. The temperature of the solution of the first material and the solution of the second material supplied from the material solution nozzle 30 to the wafer W may be set to a temperature equal to or below the room temperature, for example, a temperature in the range of 10 degrees C. to room temperature. In this case, for example, cooling devices configured to cool the solution of the first material and the solution of the second material may be installed in the circulation pipelines 32*a* and 32*b*, respectively. By lowering the temperatures of the solution of the first material and the solution of the second material, even if the concentrations of the first material and the second material are low (even if the amounts of the first material and the second material to be dissolved are small), it is possible to supply a solution having a high saturation degree. When the wafer W is cooled in a previous step (e.g., normal temperature DIW rinsing), it is possible to prevent precipitation from starting at the moment when the first material and the second material come into contact with the wafer W, that is, to prevent precipitation from starting at undesired timing, which makes it easier to control the process.

However, when it is desired to supply a high concentration solution of the first material or a high concentration solution of the second material, the solution of the first material or the solution of the second material may be maintained at a relatively high temperature by providing heaters in the circulation pipelines 32*a* and 32*b*. In this case, in order to prevent precipitation of the first material or the second material before supply, it is preferable to provide a heater, such as a tape heater, or a heat insulating material around the material solution pipeline 30*c*. Further, opening/closing valves 35*a* and 35*b* are provided between the tank 31*a* and the flow rate adjustment valve 30*a* and between the tank 31*b* and the flow rate adjustment valve 30*a*, respectively.

As illustrated in FIG. 3, the chemical liquid nozzle 20, the rinsing nozzle 22, the $N_2$ gas nozzle 24, and the decomposable polymer material solution nozzle 30 are driven by a nozzle movement mechanism 50. The nozzle movement mechanism 50 includes a guide rail 51, a movement body 52 having a built-in drive mechanism configured to be movable along the guide rail 51, and a nozzle arm 53 having a base end installed on the movement body 52 and configured to hold the nozzles 20, 22, 24, and 30 described above at the tip end thereof. The nozzle movement mechanism 50 may move the nozzles 20, 22, 24, and 30 between a position directly above the center of the wafer W held by the substrate holder 14 and a position directly above a peripheral edge of the wafer W. Furthermore, the nozzle movement mechanism 50 may be moved to a standby position outside the cup 18 in a plan view.

The substrate holder 14 of the illustrated spin chuck 11 is a so-called mechanical chuck type configured to grip the peripheral edge of the wafer W by the movable holding member 12, but is not limited thereto. The substrate holder 14 may be a so-called vacuum chuck type configured to adsorb the central portion of the rear surface of the wafer W using vacuum suction. The illustrated nozzle movement mechanism 50 is a so-called linear motion type configured to translationally move the nozzles, but may be a so-called swing arm type configured to hold the nozzles at the tip end of an arm that rotates around a vertical axis. In the illustrated example, the four nozzles 20, 22, 24, and 30 are held by a common arm, but may be held by separate arms, respectively, so that the nozzles can move independently.

Next, the material removal unit 60 will be described with reference to FIG. 4. The material removal unit 60 has a processing container 64, a hot plate 61 installed in the processing container 64 and having a resistance heater 62 embedded therein, and holding pins 63 protruding from the top surface of the hot plate 61. The holding pins 63 support the peripheral edge of the bottom surface of the wafer W, and a small gap is formed between the bottom surface of the wafer W and the top surface of the hot plate 61. An exhaust pipe 65 having a valve 66, a pump 67, and a material recovery device 68 is connected to the processing container 64. In order to prevent the first material or the second material from adhering to the exhaust pipe 65 and the processing container 64 on the upstream side of the material recovery device 68, it is preferable to provide a heater for maintaining the surfaces of the exhaust pipe 65 and the processing container 64 at a high temperature. As the material recovery device 68, various known material recovery devices may be used, such as a type in which the first material or the second material is precipitated on a cooling plate installed in the chamber through which exhaust gas flows or a type in which cooling fluid is brought into contact with the gas of the first material or the second material in the chamber through which the exhaust gas flows.

A light source 75 configured to emit ultraviolet (UV) light having a wavelength of 260 to 365 nm is installed in the processing container 64, and a transparent plate 76 configured to protect the light source 75 is further installed in the processing container 64. The UV light from the light source 75 passes through a transmission portion 76a of the transparent plate 76 and is emitted onto a wafer W.

Each of an $N_2$ gas supply source 71, an alkaline gas supply source 72, an acidic gas supply source 73, and an ozone gas supply source 74 is connected to the processing container 64.

Next, liquid processing steps (here, a chemical cleaning step and a rinsing step) executed by a substrate processing apparatus having the above-mentioned liquid processing unit 10 and a material removal unit 60, and a series of processing steps including respective steps of a substrate processing method executed thereafter will be described.

A wafer W that has been dry-etched to form a pattern on a film forming a semiconductor device, for example, a SiN film, is carried into the liquid processing unit 10 by the substrate transport mechanism 6 and is held by the spin chuck 11 in a horizontal posture.

The wafer W is rotated at a predetermined speed, the chemical liquid nozzle 20 is positioned above the center of the wafer W, the chemical liquid is ejected from the chemical liquid nozzle 20 to the wafer W, and a chemical cleaning process for removing etching residue and particles from a substrate surface using the chemical liquid is performed (chemical cleaning step). In this chemical cleaning step, for example, DHF, BHF, SC-1, SC-2, APM, HPM, or SPM may be used as the chemical liquid.

Figure 5A:
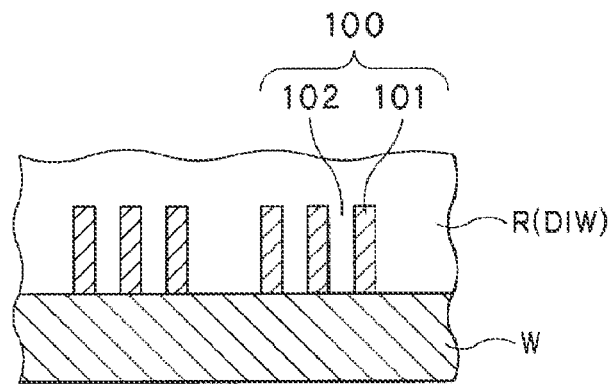
FIGS. 5A to 5E are schematic views for describing steps of a substrate processing method.

Next, while continuing to rotate the wafer W, the rinsing nozzle 22 is positioned above the center of the wafer W, the DIW is ejected from the rinsing nozzle 22 onto the wafer W, and the chemical liquid, etching residue, and particles on the wafer W are removed (rinsing step). This state is illustrated in FIG. 5A. When a drying process, such as spin drying, is continuously performed as it is, pattern collapse (collapse of convex portions 101 on a pattern 100) may occur, as described in the Background section. After this rinsing step, a series of steps of a substrate drying method are executed.

Figure 5B:
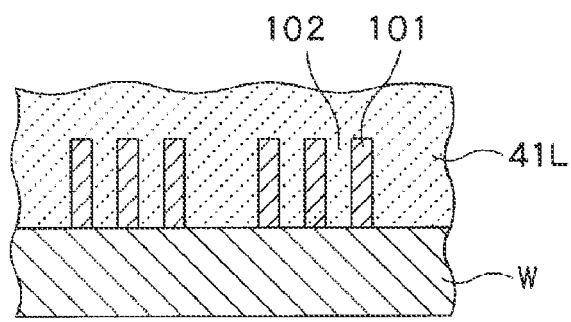

First, while continuing to rotate the wafer W, the material solution nozzle 30 is positioned above the center of the wafer W, and a solution 41L of the first material is ejected from the material solution nozzle 30 onto the wafer W so as to replace the DIW on the wafer W with the solution 41L of the first material and to fill concave portions 102 between the patterns 100 (material filling step). This state is illustrated in FIG. 5B. Here, the solution of the first material contains 10 wt % of thermally decomposable poly-α-methylstyrene and tetrahydrofuran (THF) as a solvent. When the DIW is replaced with the solution 41L of the first material and the space between the patterns 100 is filled with the solution 41L of the first material, the film thickness of the solution 41L of the first material is adjusted by adjusting the rotation of the wafer W. In a solvent drying step to be described later, since the solvent is dried from the solution 41L of the first material, the thickness of the obtained film of the first material (a solid film) becomes thinner than the film thickness of the solution of the first material. In consideration of this point, the film thickness of the solution of the first material is adjusted such that a film of the first material (solid film) having a desired thickness is finally obtained. At the time of transition from the rinsing step to the first material filling step, when the upper ends of the convex portions 101 of the pattern are not sufficiently immersed in the DIW, the surface tension of the DIW acts on the convex portions 101, and thus the convex portions 101 may fall down. Accordingly, it is preferable to perform an operation, such as (a) increasing the ejected amount of DIW at the end of the rinsing step, (b) reducing the rotation speed of the wafer W at the end of the rinsing step and the beginning of the first material filling step, or stopping the rotation of the wafer W, or (c) causing the end of the rinsing step and the beginning of the material filling step to overlap each other (continuing to eject the DIW until the beginning of the material filling step). When the end of the rinsing step and the beginning of the material filling step overlap each other, the nozzle arm 53 is moved while the rinsing liquid is being ejected from the rinsing nozzle 22, and the material solution nozzle 30 is positioned above the center of the wafer W. Then, after the solution 41L of the first material starts to be ejected to the wafer W, ejection of the rinsing liquid is stopped.

Figure 5C:
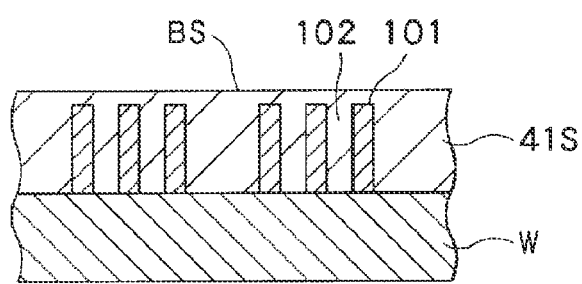

After the material filling step, the solvent in the solution 41L of the first material is dried so that the first material is precipitated, and a film made of the solid first material is formed (material drying step). The state at the end of the material drying step is illustrated in FIG. 5C, and the concave portions 102 are filled with the first material 41S in the solid state. The thickness of the film made of the first material 41S is preferably as small as possible, as long as the first material 41S sufficiently covers the convex portions 101 of the pattern. Since surface tension acts on the convex portions 101 of the pattern even when the solvent is dried, a film made of the first material 41S in the solid state may be formed between the patterns to the extent that the pattern does not collapse due to surface tension. In addition, the thickness of the decomposable polymer material film BS to be formed is preferably uniform. The solvent drying step may be performed by various methods, but when the illustrated liquid processing unit 10 is used, the solvent drying step may be performed by spraying $N_2$ gas from the $N_2$ gas nozzle to the wafer W while rotating the wafer W (shaking off by centrifugal force). By controlling the rotation of the wafer W, it is possible to control the flow of the solution of the first material ejected onto the wafer W toward the outer circumference. Thus, it is easy to adjust the film thickness of the solution of the first material and the thickness of the film made of the first material. In addition, it is possible to form a film that is made of the first material and has a uniform thickness. The drying of the solvent may be promoted by spraying a heated gas, such as hot $N_2$ gas, onto the wafer W. In such a case, the drying of the solvent is performed under the condition in which the temperature of the wafer W, that is, the temperature of the first material, is maintained at a temperature lower than the sublimation or decomposition temperature of the first material, specifically, a temperature at which the solvent in the solution is dried but the first material does not sublimate or decompose.

The material drying step may be carried out or promoted by spraying not only the above-mentioned $N_2$ gas but also other drying promoting fluids such as clean air and clean dry air (CDA). Further, the material drying step may be carried out or promoted by heating the wafer W to a temperature below the sublimation or decomposition temperature of the first material, specifically a temperature at which the solvent in the solution is dried but the first material does not sublimate or decompose, using a heater 14A, such as a resistance heater embedded in a disk portion of the substrate holder of the spin chuck, or a heater such as an LED lamp heater installed on a top plate.

Figure 5D:
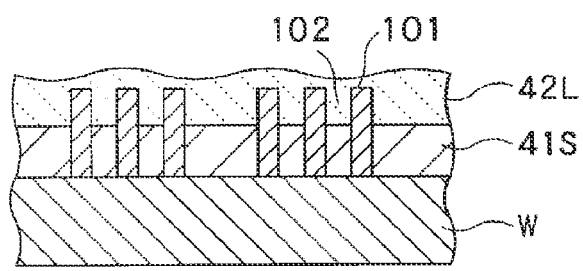
Figure 5E:
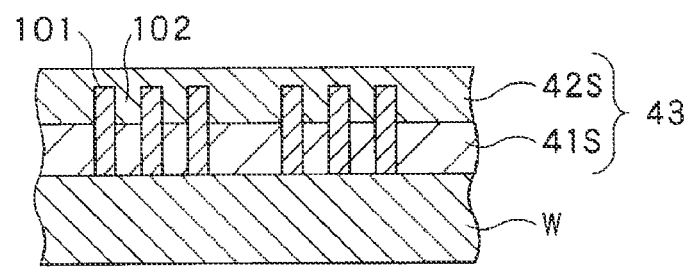

Next, as illustrated in FIG. 5D, a solution 42L of the second material is filled on the first material 41S in the solid state in the concave portions 102 of the wafer W in the same manner as in the case in which the first material S in the solid state is formed (material filling step). At this time, the first material 41S in the solid state partially dissolves into the solution 42L of the second material, and the height of the first material 41S is slightly lowered. In this case, the solution of the second material contains 10 wt % of thermally decomposable poly(isobutyl methacrylate) and tetrahydrofuran (THF) as a solvent.

Next, the solvent in the solution 42L of the second material is dried (material drying step), the second material is precipitated, and the second material 42S in the solid state is formed on the first material 41S in the solid state.

In this way, it is possible to form, in the concave portions 102 of the wafer W, a laminate 43 having a two-layer structure including the first material 41S in the solid state, which forms the lower layer, and the second material 42S in the solid state, which forms the upper layer formed on the first material 41S (film forming step).

In the laminate 43 formed in the concave portions 102 of the wafer W, the first material 41S in the solid state contains poly-α-methylstyrene, and the second material 42S in the solid state contains poly(isobutyl methacrylate). Tetrahydrofuran (THF) is used as the solvent in the solutions of the first material and the second material.

An example in which the two-layer structure laminate 43 including the first material 41S in the solid state and the second material 42S in the solid state is formed in the concave portions 102 of the wafer W has been illustrated, but the present disclosure is not limited thereto. A three-layer structure laminate or a four-or-more layer structure laminate in the solid state may be formed in the concave portions 102 of the wafer W.

Figure 6A:
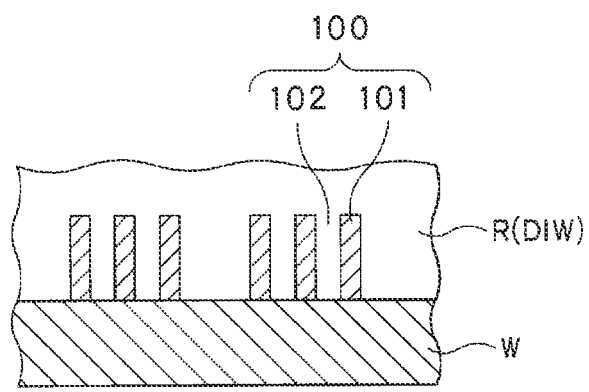
FIGS. 6A to 6D are schematic views for describing steps of a substrate processing method as a modified example.
Figure 6B:
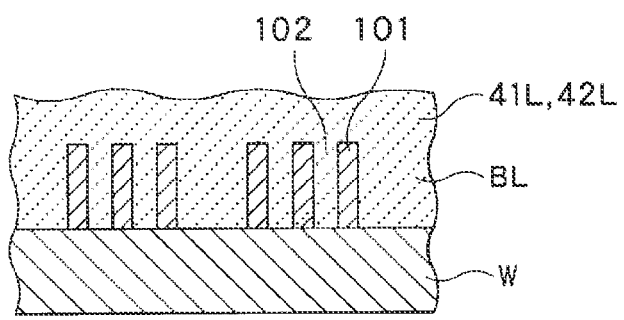

In addition, an example in which the concave portions 102 of the wafer W are filled with the solution 41L of the first material and the solvent is dried so as to form the first material 41S in the solid state, after which the solution 42L of the second material is filled on the first material 41S in the solid state and the solvent is dried so as to form the second material 42S in the solid state, thereby forming the laminate 43 in the concave portions 102, has also been illustrated. However, as illustrated in FIG. 6A, a mixed solution of the solution 41L of the first material and the solution 42L of the second material may be supplied onto the wafer W first. In this case, DIW on the wafer W is replaced by the solution 41L of the first material and the solution 42L of the second material (see FIG. 6B).

At this time, the film thickness of the mixed solution of the solution 41L of the first material and the solution 42L of the second material is adjusted by adjusting the rotation of the wafer W.

In this case, poly-α-methylstyrene having a large specific gravity is used as the first material, and poly(isobutyl methacrylate) having a small specific gravity is used as the second material.

Figure 6C:
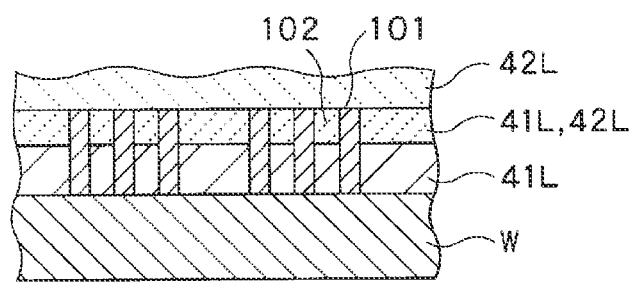

Thereafter, the wafer W is left alone. As a result, the solution 41L of the first material forms the lower layer, and the solution 42L of the second material forms the upper layer. An intermediate layer is formed by the mixed solution of the solution 41L of the first material and the solution 42L of the second material (see FIG. 6C).

Figure 6D:
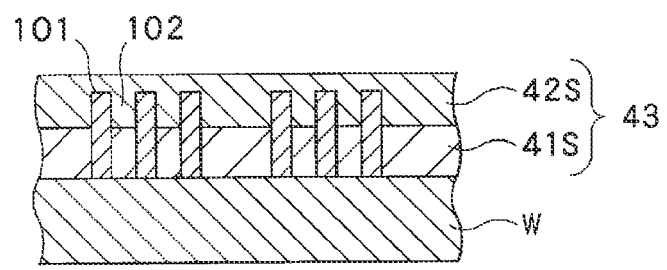

Thereafter, the solvent in the solution 41L of the first material and the solvent in the solution 42L of the second material are dried. As a result, it is possible to form, in the concave portions 102 of the wafer W, a two-layer structure laminate 43 including the first material 41S in the solid state, which forms the lower layer, and the second material 42S in the solid state, which forms the upper layer formed on the first material 41S (see FIG. 6D).

According to the embodiment illustrated in FIGS. 6A to 6D, it is possible to form a laminate 43 having a two-layer structure in the concave portions of the wafer W merely by supplying the mixed solution of the first material and the second material to the wafer W and then drying the solvents in the mixed liquid, without needing to perform two supplying steps and drying steps, i.e. the steps of supplying and drying the first material and the subsequent steps of supplying and drying the second material.

After forming the laminate 43 including the first material 41S and the second material 42S in the solid state in the concave portions 102 of the wafer W in this way, the wafer W is carried out of the liquid processing unit 10 by the substrate transport mechanism 6 and is carried into the processing container 64 of the material removal unit 60 illustrated in FIG. 4. In this case, the wafer W is carried into the processing container 64 through a wafer gate 64A. Next, the inside of the processing container 64 is suctioned by the pump 67 installed in the exhaust pipe 65 connected to the processing container 64, and the temperature of the wafer W is heated to a temperature higher than the decomposition temperature of the decomposable polymer material by the heated hot plate 61.

Next, acts of the material removal unit 60, that is, the material removal process, will be described in detail.

As described above, in the concave portions 102 of the wafer W, the laminate 43 including the first material 41S in the solid state, which is made of poly-α-methylstyrene, and the second material 42S in the solid state, which is made of poly(isobutyl methacrylate), is formed.

In the material removal unit 60, the wafer W is heated by the heated hot plate 61 at a temperature equal to or higher than the thermal decomposition temperature of the poly (isobutyl methacrylate) of the second material (200 degrees C.), for example, at 200 degrees C. for 30 minutes.

At this time, the inside of the processing container 64 of the material removal unit 60 is depressurized by the pump 67 of the exhaust pipe 65. At the same time, an $N_2$ gas atmosphere is formed in the processing container 64 by the $N_2$ gas supply source 71, and the second material 42S in the solid state, which fills the concave portions 102 of the wafer W, is decomposed, liquefied, volatilized, and removed.

FIG. 7 illustrates how the second material 42S in the solid state is decomposed. FIG. 7 is a schematic view illustrating how the second material 42S in the solid state is separated. As illustrated in FIG. 7, the second material 42S in the solid state on the wafer W is composed of a large number of monomers, the wafer W is heated such that the second material 42S is decomposed, and the monomers are separated from each other. Thereafter, the monomers of the second material 42S separated from each other are volatilized and removed from the wafer W.

In this way, the second material is removed from the laminate 43 including the first material 41S in the solid state and the second material 42S in the solid state formed in the concave portions 102 of the wafer W. The state of the wafer W during this period is illustrated in FIG. 8.

Figure 8:
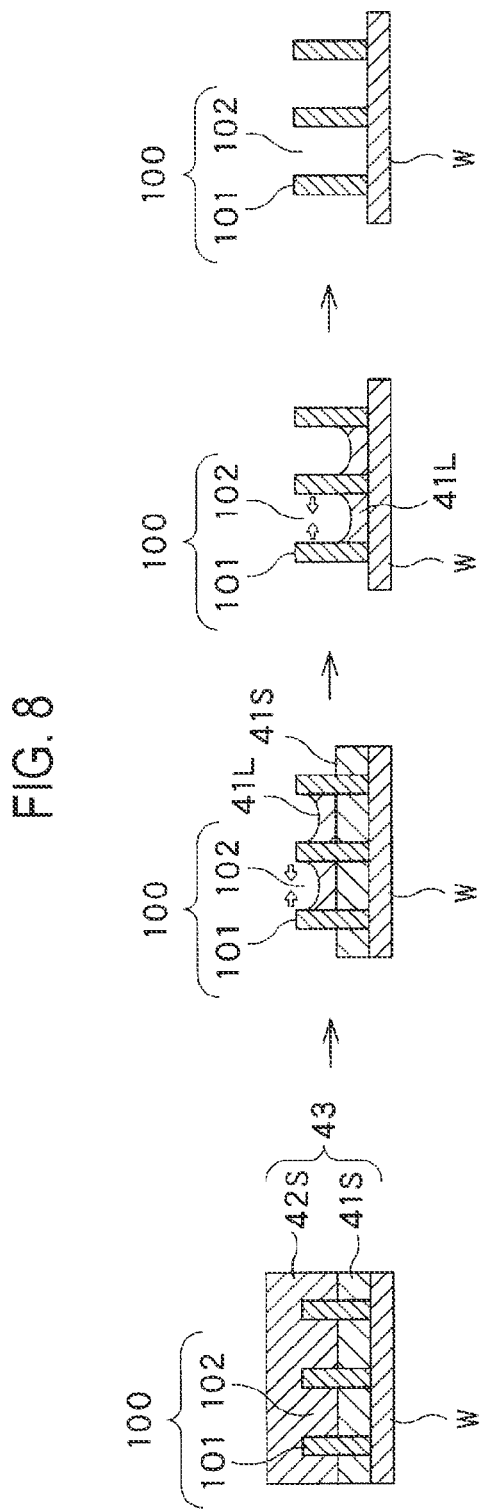
FIG. 8 is a view illustrating acts of removing a second material from a wafer and then removing a first material.

Thereafter, as illustrated in FIG. 8, in the material removal unit 60, the wafer W is heated at a temperature equal to or higher than the decomposition temperature of poly-α-methylstyrene (287 degrees C.), e.g., at 300 degrees C. for 30 minutes by the hot plate 61 in the material removal unit 60 in the same manner as in the acts of removing the second material 42S. At this time, the inside of the processing container 64 of the material removal unit 60 is depressurized by the pump 67 of the exhaust pipe 65. At the same time, an $N_2$ gas atmosphere is formed in the processing container 64 by the $N_2$ gas supply source 71, and the first material 41S in the solid state in the concave portions 102 of the wafer W is decomposed, liquefied, volatilized, and removed.

During this period, the second material 42S in the solid state, which forms the upper layer of the laminate 43 in the concave portions 102 of the wafer W, is decomposed first, liquefied, and then volatilized and evaporated. In this case, it is conceivable that the second material 42S, which forms the upper layer, is liquefied and exerts surface tension on the convex portions 101 of the pattern 100. However, even after the second material 42S is decomposed and liquefied, since the first material 41S in the solid state, which forms the lower layer, remains in the concave portion 102, excessive force is not applied to the convex portions 101.

Since the thermal decomposition temperature of the first material 41S is considerably higher than the thermal decomposition temperature of the second material 42S, thermal decomposition of the first material 41S does not occur during the thermal decomposition of the second material 42S.

In this way, it is possible to sequentially and effectively remove the second material 42S and the first material 41S existing in the concave portions 102 of the wafer W.

FIG. 8 illustrates a state at the end of the material removal step. Since the decomposable polymer material filling the concave portions 102 has been removed, a desired pattern has been obtained. The decomposed monomers of the first material and the second material are recovered by the material recovery device 68. Then, after the substrate drying method is completed, the wafer W is carried out of the material removal unit 60 by the substrate transport mechanism 6 and is transported to the carrier C via the delivery part.

According to the above-described embodiment, the rinsing liquid, which has entered the concave portions 102 in the pattern 100 after the rinsing step, is replaced with the solution of the first material or the mixed solution of the first material 41S and the second material 42S. Next, the concave portions 102 are filled with the solid of the first material 41S and the solid of the second material 42S precipitated by drying the solvents in the solution of the first material and the solution of the second material. Thereafter, by heating the wafer W, the second material in the solid state and the first material in the solid state are sequentially decomposed and removed from the concave portions 102. Therefore, even if the decomposed second material 42S remains in the concave portions 102 in the liquid state, since the first material 41S in the solid state remains in the concave portions 102, no excessive surface tension is applied to the convex portions 101 from the second material in the liquid state. Therefore, it is possible to prevent collapse of the convex portions 101, that is, pattern collapse.

By carrying out the material drying step while rotating the wafer W, the film thickness of the laminate 43 including the solid first material 41S and the second material 42S is reduced, as long as the laminate 43 sufficiently covers the convex portions 101 of the pattern. Therefore, it is possible to complete the subsequent material removal step in a short time, and thus to shorten the processing time. Further, by making the film thickness of the laminate 43 including the first material 41S and the second material 42S uniform, it is possible to minimize the time required for the material removal step.

Figure 9:
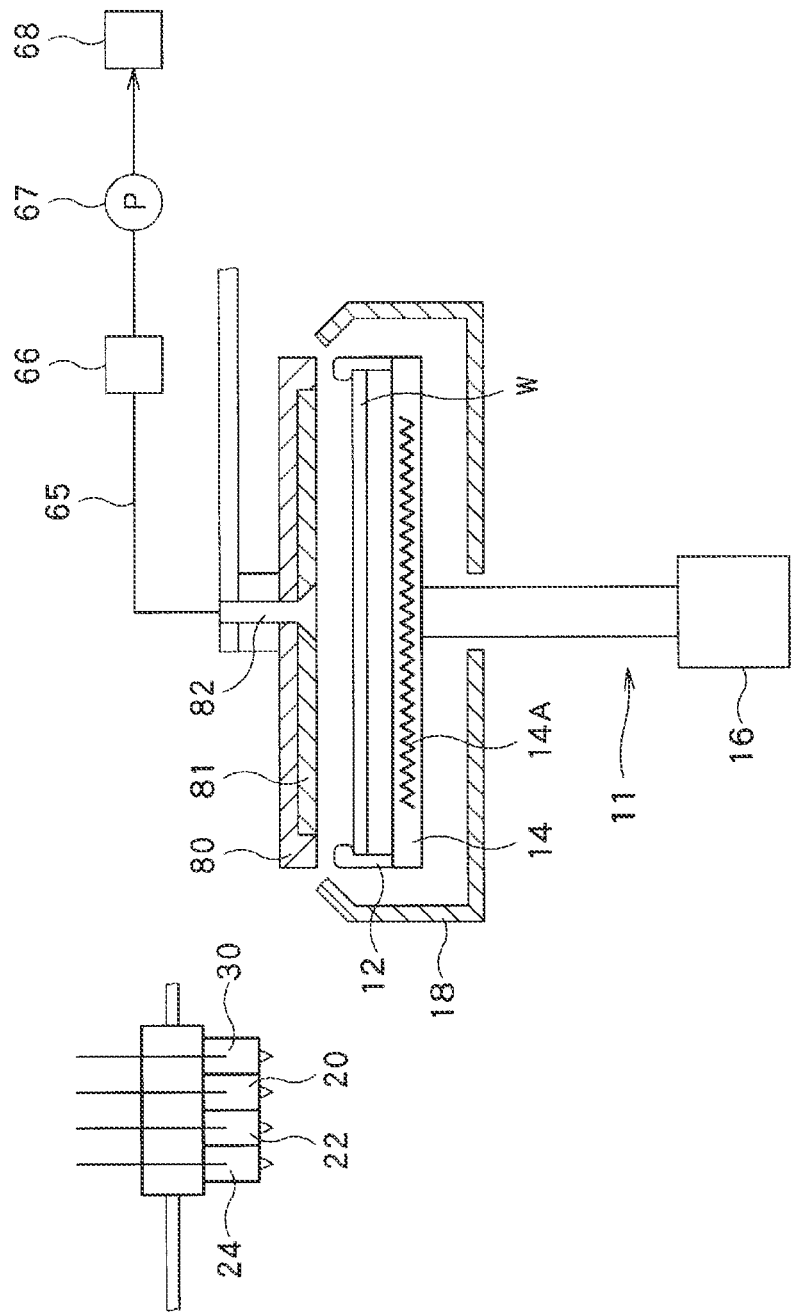
FIG. 9 is a schematic diagram illustrating a configuration of a single processing unit capable of performing a series of steps of a substrate processing method.

In the embodiment described above, individual steps from the rinsing step to the material drying step are performed in one single processing part (the liquid processing unit 10), and only the material removal step is performed by another processing part (polymer material removal). However, in addition to the steps from the rinsing step to the material drying step, the material removal step may be performed in the one processing part (unit). In this case, components may be added to the liquid processing unit 10 illustrated in FIG. 2 so as to configure the liquid processing unit as illustrated in FIG. 9. That is, as illustrated in FIG. 9, the heater 14A, such as a resistance heater, is installed on the disk portion of the substrate holder 14. In addition, a top plate 80, which can be raised and lowered, is installed to cover the portion above the wafer W held by the substrate holder 14. In the top plate 80, a heater, such as an LED lamp heater 81 is installed. An exhaust hole 82 is formed in the central portion of the top plate 80, and an exhaust pipe 65 provided with a valve 66, a pump 67, and a material recovery device 68 is connected to the exhaust hole 82 (which may be the same as those illustrated in FIG. 4). The nozzles 20, 22, 24, and 30 are configured to eject a chemical liquid, a rinsing liquid, the solutions of the first material and the second material, and a drying promoting fluid onto the wafer W, and these nozzles are movable between a position above the center of the wafer W and a standby position outside the cup 18.

In the processing unit having such a configuration, first, a substrate is carried into the processing unit in the state in which the top plate 80 is raised, and the wafer W is held by the holding member 12. The nozzles move above the wafer W held by the holding member 12, and respective fluids are ejected from the nozzles 20, 22, 24, and 30. Then, when the material drying step is completed, the nozzles 20, 22, 24, and 30 are moved to the standby position outside the cup 18. After the nozzles are brought outside the cup 18, the top plate 80 is lowered so as to form a processing space between the top plate 80 and the substrate holder 14. Thereafter, the wafer W is heated to a predetermined temperature by the heater 14A, and the first material and the second material, which are filled in the concave portions 102 of the pattern 100, are removed. At this time, the surfaces of the exhaust pipe 65 and the top plate 80 are also heated to a temperature higher than the decomposition temperatures of the first material and the second material. When the first material and the second material are removed and the substrate drying method is completed, the top plate 70 is raised and the wafer W is carried out of the processing unit.

Next, a modification of the present embodiment will be described.

An example in which thermally decomposable materials are used as the first material 41S and the second material 42S formed in the concave portions 102 of the wafer W has been illustrated, but the present disclosure is not limited thereto. As the first material 41L or the second material 42L, a photodecomposable material, such as polyketone, may be used. In this case, in the liquid processing unit 10 illustrated in FIG. 2, the first material 41S in the solid state or the second material 42S in the solid state is formed in the concave portions 102 of the wafer W using, as the solution of the decomposable polymer material, a solution containing polyketone at a solution concentration of 10 wt % and tetrahydrofuran (THF) as a solvent.

The inside of the processing container 64 of the material removal unit 60 is depressurized by the pump 67 of the exhaust pipe 65. In addition, an $N_2$ gas atmosphere is formed in the processing container 64 by the $N_2$ gas supply source 71.

During this period, the wafer W carried into the processing container 64 is held by the holding pins 63 on the top surface of the hot plate 61, and the wafer W is heated by the hot plate 61 to a temperature of, for example, 60 degrees C. to 150 degrees C. In addition, the wafer W held by the hot plate 61 of the processing container 64 is continuously irradiated with ultraviolet (UV) light having a wavelength of 260 to 365 nm from the light source 75. A transparent plate 76 is installed in the processing container 64 to protect the light source 75, and the UV light emitted from the light source 75 is radiated onto the wafer W through a transparent portion 76a of the transparent plate 76.

At this time, the first material 41S or the second material 42S made of polyketone in the solid state, with which the concave portions 102 of the wafer W have been filled, is photo-decomposed, removed from the wafer W, discharged through the exhaust pipe 65, and sent to the material recovery device 68.

The light emitted from the light source 75 is not limited to UV light having a wavelength of 260 to 365 nm, and light having a wavelength of 150 to 800 nm may be used.

Next, another modification of the present embodiment will be described.

As the first material 41S or the second material 42S formed in the concave portions 102 of the wafer W, a gas-decomposable polyester may be used. In this case, in the liquid processing unit 10, the first material 41S in the solid state or the second material 42S in the solid state is formed in the concave portions 102 of the wafer W using, as the solution of the decomposable polymer material, a solution containing polyester at a solution concentration of 10 wt % and tetrahydrofuran (THF) as a solvent.

In the material removal unit 60, a 50 vol % of alkaline gas, such as ammonia, methylamine, or dimethylamine, is supplied from the alkaline gas supply source 72 into the processing container 64, and the inside of the processing container 64 is filled with alkaline gas and air containing water.

During this period, the wafer W is held by the holding pins 63 on the top surface of the hot plate 61, and the wafer W is heated by the hot plate 61 to a temperature of, for example, 60 degrees C. to 200 degrees C.

At this time, the first material 41S or the second material 42S made of polyester in the solid state and filling the concave portions 102 of the wafer W is decomposed through a gas reaction with the alkaline gas.

Next, $N_2$ gas is supplied from the $N_2$ gas supply source 71 into the processing container 64. At this time, the inside of the processing container 64 is suctioned by the pump 67, and the atmosphere inside the processing container 64 is replaced 100% by $N_2$ gas.

Next, the supply of the $N_2$ gas from the $N_2$ gas supply source 71 to the processing container 64 is stopped and the inside of the processing container 64 is suctioned by the pump 67, and thus the inside of the processing container 64 is depressurized. During this period, the wafer W on the hot plate 61 is continuously heated to a temperature of, for example, 60 degrees C. to 200 degrees C. for 30 minutes.

In the processing container 64, the first material 41S or the second material 42S decomposed through gas reaction is then suctioned by the pump 67, discharged through the exhaust pipe 65, and sent to the material recovery device 68.

In the modification described above, an example in which an alkaline gas is supplied from the alkaline gas supply source 72 to the processing container 64 so as to decompose the first material 41S or the second material 42S has been illustrated, but the present disclosure is not limited thereto. An acid gas, such as hydrochloric acid, carbon dioxide, or hydrogen sulfide, may be supplied from the acidic gas supply source 73 to the processing container 64 so as to decompose the decomposable polymer material BS with the acid gas.

Next, another modification of the present embodiment will be described.

A sublimable material, such as naphthalene, adamantane, camphor, and maleic anhydride (including a long-chain alkyl-substituted derivative), may be used as the second material 42S formed in the concave portions 102 of the wafer W. In this case, in the liquid processing unit 10, a solution containing the solution of a sublimable material and a solvent (e.g., tetrahydrofuran (THF)) may be used to form the second material 42S in the solid state in the concave portions 102 of the wafer W.

In the processing container 64 of the material removal unit 60, the wafer W is heated by the hot plate 61 to a temperature equal to or higher than the sublimation temperature of the sublimable material (e.g., 100 degrees C. to 300 degrees C.). In this case, the inner walls of the exhaust pipe 65 and the processing container 64 are also heated to the sublimation temperature or higher.

Next, the second material 42S in the concave portions 102 of the wafer W is sublimated and removed from the wafer W. At this time, the sublimable material, which has been sublimated and removed from the wafer W, is recovered by the material recovery device 68 and reused. Since the sublimable material is heated and is relatively easily decomposed through sublimation, it is preferable to use the sublimable material as the second material 42S for forming the upper solidified film, rather than as the first material 41S for forming the lower solidified film.

Next, another modification of the present embodiment will be described.

An ozone-gas-decomposable resist polymer may be used as the first material 41S or the second material 42S formed in the concave portions 102 of the wafer W. In this case, in the liquid processing unit 10, the first material 41S in the solid state or the second material 42S in the solid state is formed in the concave portions 102 of the wafer W using, as the solution of the decomposable polymer material, a solution containing a resist polymer at a solution concentration of 10 wt % and PGMEA as a solvent.

In the material removal unit 60, 50 vol % of ozone gas is supplied from the ozone gas supply source 74 into the processing container 64, and the inside of the processing container 64 is filled with the ozone gas.

During this period, the wafer W is held by the holding pins 63 on the top surface of the hot plate 61, and the wafer W is heated by the hot plate 61 to, for example, 100 degrees C.

At this time, the first material 41S or the second material 42S made of the resist polymer in the solid state and filling the concave portions 102 of the wafer W is decomposed through a gas reaction with the ozone gas.

Next, $N_2$ gas is supplied from the $N_2$ gas supply source 71 into the processing container 64. At this time, the inside of the processing container 64 is suctioned by the pump 67, and the atmosphere inside the processing container 64 is replaced 100% by $N_2$ gas.

Next, the supply of the $N_2$ gas from the $N_2$ gas supply source 71 to the processing container 64 is stopped, the inside of the processing container 64 is suctioned by the pump 67, and the inside of the processing container 64 is thus depressurized. During this period, the wafer W on the hot plate 61 is continuously heated for 2 hours.

In the processing container 64, the first material 41S or the second material 42S decomposed through gas reaction is then suctioned by the pump 67, discharged through the exhaust pipe 65, and sent to the material recovery device 68.

Further, in each of the embodiments and modifications described above, individual steps of the substrate drying method are combined with a chemical cleaning step, but the present disclosure is not limited thereto. Individual steps of the substrate drying method may be combined with a developing step. For example, a developing step is carried out on a photoresist film that has been exposed by an exposure device and has undergone a predetermined post-exposure process, for example, a post-exposure baking (PEB) process, so as to form a predetermined pattern. After the rinsing step performed after this developing step, each of the steps of the substrate drying method described above may be performed. Even when the aspect ratio of the pattern formed in the developing step is high, the pattern may collapse during the drying step performed after the rinsing step using a high-surface-tension liquid such as DIW. Thus, the substrate drying method described above is useful. The developing unit for executing this method may be constructed by replacing the chemical liquid supply system of the liquid processing unit 10 illustrated in FIG. 1 (e.g., a liquid supply source, a nozzle, a pipeline, and a valve) with the developing liquid supply system.

EXAMPLE

Next, specific examples of the present embodiment will be described with reference to FIG. 10. In the examples shown in FIG. 10, as the first material of the lower layer, any of a thermally decomposable polymer material, a photodecomposable polymer material, a gas-decomposable polymer material which is decomposable by an acidic gas or an alkaline gas, and an ozone-gas-decomposable polymer material which is decomposable by ozone gas, was used. As the second material of the upper layer, a sublimable material, a thermally decomposable polymer material, a photodecomposable polymer material, a gas-decomposable polymer material which is decomposable by an acidic gas or an alkaline gas, and an ozone-gas-decomposable polymer material which is decomposable by ozone gas, was used.

FIG. 10 shows combination aspects of Examples 1 to 20. Among these, a combination of Example 8 and Example 20 is possible, but better effects cannot be expected therefrom. Therefore, a detailed description thereof will be omitted.

Further, in the following Examples 1 to 20, the first material is also referred to as a lower layer, and the second material is also referred to as an upper layer.

(Example 1) Combination of Sublimable Polymer and Thermally Decomposable Polymer (a) Film Forming Step
  i. A solution of 10 wt % of a thermally decomposable poly(isobutyl methacrylate) as the first material and tetrahydrofuran (THF) as a solvent is spin-coated onto a wafer.
  ii. Next, the thin film fabricated in i is heated at 60 degrees C. for 5 minutes, and the solvent is volatilized so as to form the first material in the solid state (also referred to as a "lower solidified film").
  iii. Next, a solution of 10 wt % of a sublimable anthracene as the second material and an IPA as a solvent is spin-coated on the lower solidified film and is naturally dried so as to form a solid second material in the solid state (also referred to as an "upper solidified film").
(b) Material Removal Step
  i. The film-formed wafer is heated at 100 degrees C. for 30 minutes in the processing container (hereinafter, also referred to as a "depressurized chamber"), and the anthracene film (the upper solidified film) is removed through sublimation.
  ii. Next, the wafer is heated at 200 degrees C. for 30 minutes, and the poly(isobutyl methacrylate) film (lower solidified film) is removed through thermal decomposition.

(Example 2) Combination of Thermally Decomposable Polymer and Thermally Decomposable Polymer (a) Film Forming Step
  i. A solution of 10 wt % of a thermally decomposable poly-α-methylstyrene as the first material and THF is spin-coated on a wafer.
  ii. Next, the thin film fabricated in i is heated at 60 degrees C. for 5 minutes, and the solvent is volatilized so as to form a lower solidified film.
  iii. Next, a solution of 10 wt % of a thermally decomposable poly(isobutyl methacrylate) as the second material and THF is spin-coated on the lower solidified film.
  iv. Next, the thin film fabricated in iii is heated at 60 degrees C. for 5 minutes, and the solvent is removed so as to form an upper solidified film.
(b) Material Removal Step
  i. The film-formed wafer is heated at 200 degrees C. for 30 minutes in a depressurized chamber, and the poly (isobutyl methacrylate) film (upper solidified film) is removed through thermal decomposition.
  ii. Next, the wafer is heated at 300 degrees C. for 30 minutes, and the poly-α-methylstyrene film (lower solidified film) is decomposed and removed.

(Example 3) Combination of Photodecomposable Polymer and Thermally Decomposable Polymer (a) Film Forming Step
  i. A solution of 10 wt % of a thermally decomposable poly(isobutyl methacrylate) as the first material and THF is spin-coated on a wafer.
  ii. Next, the thin film fabricated in i is heated at 60 degrees C. for 5 minutes so as to form a lower solidified film.
  iii. A solution of 10 wt % of a photodecomposable polyketone as the second material and THF is spin-coated on the lower solidified film.
  iv. Next, the thin film fabricated in iii is heated at 60 degrees C. for 5 minutes, and the solvent is volatilized so as to form an upper solidified film.
(b) Material Removal Step
  i. The film-formed wafer is irradiated with ultraviolet light (wavelength: 250 to 365 nm) while being heated at 100 degrees C. in a depressurized chamber, and the polyketone film (upper solidified film) is removed through photodecomposition.
  ii. Next, light emission is stopped.

iii. Next, the wafer is heated at 200 degrees C. for 30 minutes, and the poly(isobutyl methacrylate) film (lower solidified film) is removed through thermal decomposition.

(Example 4) Combination of Acid- or Alkali-Gas-Decomposable Polymer and Thermally Decomposable Polymer (a) Film Forming Step
  i. A solution of 10 wt % of a thermally decomposable poly(isobutyl methacrylate) as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a gas-decomposable polyester as the second material and THF is spin-coated on the lower solidified film.
  iv. Next, the thin film fabricated in iii is heated at 60 degrees C. for 5 minutes, and the solvent is volatilized so as to form an upper solidified film.
(b) Material Removal Step
  i. The film-formed wafer is heated at 100 degrees C. for 1 hour in a 50 vol % ammonia atmosphere, and the polyester film (upper solidified film) is decomposed and removed using ammonia gas.
  ii. Next, the atmosphere inside the processing container (hereinafter, also referred to as a "depressurized chamber") is replaced with a 100% $N_2$ atmosphere.
  iii. The inside of the depressurized chamber is depressurized, and the wafer is heated at 100 degrees C. for 30 minutes so as to remove the decomposed residue of the upper solidified film.
  iv. Next, the wafer is heated at 300 degrees C. for 30 minutes, and the poly(isobutyl methacrylate) film (lower solidified film) is removed through thermal decomposition.

(Example 5) Combination of Ozone-Decomposable Polymer and Thermally Decomposable Polymer (a) Film Forming Step
  i. A solution of 10 wt % of a thermally decomposable poly(isobutyl methacrylate) as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of an ozone-decomposable resist polymer as the second material and PGMEA is spin-coated on the lower solidified film.
  iv. Next, the thin film fabricated in iii is heated at 60 degrees C. for 5 minutes, and the solvent is volatilized so as to form an upper solidified film.
(b) Material Removal Step
  i. The film-formed wafer is heated at 100 degrees C. for 2 hours in a 50 vol % ozone atmosphere, and the resist polymer film (upper solidified film) is decomposed and removed using ozone gas.
  ii. Next, the atmosphere inside the depressurized chamber is replaced with a 100% $N_2$ atmosphere.
  iii. Next, the depressurized chamber is depressurized, the wafer is heated at 300 degrees C. for 30 minutes, and the poly(isobutyl methacrylate) film (lower solidified film) is removed through thermal decomposition.

(Example 6) Combination of Sublimable Polymer and Photodecomposable Polymer (a) Film Forming Step
  i. A solution of 10 wt % of a photodecomposable polyketone as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a sublimable anthracene as the second material and IPA is spin-coated on the lower solidified film and is naturally dried so as to form an upper solidified film.
(b) Material Removal Step
  i. The film-formed wafer is heated at 100 degrees C. for 30 minutes in a depressurized chamber, and the anthracene film (upper solidified film) is removed through sublimation.
  ii. Next, the wafer is irradiated with ultraviolet light (wavelength: 250 to 365 nm) while being heated at 100 degrees C. in the depressurized chamber, and the polyketone film (lower solidified film) is removed through photodecomposition.

(Example 7) Combination of Thermally Decomposable Polymer and Photodecomposable Polymer (a) Film Forming Step
  i. A solution of 10 wt % of a photodecomposable polyketone as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a thermally decomposable poly(isobutyl methacrylate) as the second material and THF is spin-coated on the lower solidified film.
  iv. The thin film fabricated in iii is heated at 60 degrees C. for 5 minutes, and the solvent is volatilized so as to form an upper solidified film.
(b) Material Removal Step
  i. The film-formed wafer is heated at 200 degrees C. for 30 minutes in a depressurized chamber, and the poly(isobutyl methacrylate) film (upper solidified film) is removed through thermal decomposition.
  ii. The wafer is irradiated with ultraviolet light (wavelength: 250 to 365 nm) while being heated at 100 degrees C. in the depressurized chamber, and the polyketone film (lower solidified film) is removed through photodecomposition.

(Example 8) Combination of Photodecomposable Polymer and Photodecomposable Polymer Example 8 has the same configuration and acting effect as those of the above-described example, and a detailed description thereof will be omitted.

(Example 9) Combination of Acid- or
Alkali-Gas-Decomposable Polymer and
Photodecomposable Polymer (a) Film Forming Step
  i. A solution of 10 wt % of a photodecomposable polyketone as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a gas-decomposable polyester as the second material and THF is spin-coated on the lower solidified film.
  iv. Next, the thin film fabricated in iii is heated at 60 degrees C. for 5 minutes, and the solvent is volatilized so as to form an upper solidified film.
(b) Material Removal Step
  i. The film-formed wafer is heated at 100 degrees C. for 1 hour in a 50 vol % ammonia atmosphere, and the polyester film (upper solidified film) is decomposed and removed using ammonia gas.
  ii. The atmosphere inside the depressurized chamber is replaced with a 100% $N_2$ atmosphere.
  iii. The inside of the depressurized chamber is depressurized, and the wafer is heated at 100 degrees C. for 30 minutes so as to remove the decomposed residue of the upper solidified film.
  iv. The wafer is irradiated with ultraviolet light (wavelength: 250 to 365 nm) while being heated at 100 degrees C. in the depressurized chamber, and the polyketone film (lower solidified film) is removed through photodecomposition.

(Example 10) Combination of
Ozone-Decomposable Polymer and
Photodecomposable Polymer (a) Film Forming Step
  i. A solution of 10 wt % of a photodecomposable polyketone as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a gas-decomposable resist polymer as the second material and PGMEA is spin-coated on the lower solidified film.
  iv. Next, the thin film fabricated in iii is heated at 60 degrees C. for 5 minutes, and the solvent is volatilized so as to form an upper solidified film.
(b) Material Removal Step
  i. The film-formed wafer is heated at 100 degrees C. for 2 hours in a 50 vol % ozone atmosphere, and the resist polymer film (upper solidified film) is decomposed and removed using ozone gas.
  ii. The atmosphere inside the chamber is replaced with a 100% $N_2$ atmosphere.
  iii. The wafer is irradiated with ultraviolet light (wavelength: 250 to 365 nm) while being heated at 100 degrees C. in the depressurized chamber, and the polyketone film (lower solidified film) is removed through photodecomposition.

(Example 11) Combination of Sublimable Polymer
and Acid- or Alkali-Gas-Decomposable Polymer (a) Film Forming Step
  i. A solution of 10 wt % of a gas-decomposable polyester as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a sublimable anthracene as the second material and IPA is spin-coated on the lower solidified film and is naturally dried so as to form an upper solidified film.
(b) Material Removal Step
  i. The film-formed wafer is heated at 100 degrees C. for 30 minutes in a depressurized chamber, and the anthracene film (upper solidified film) is removed through sublimation.
  ii. The film-formed wafer is heated at 100 degrees C. for 1 hour in a 50 vol % ammonia atmosphere, and the polyester film (lower solidified film) is decomposed and removed using ammonia gas.
  iii. The atmosphere inside the chamber is replaced with a 100% $N_2$ atmosphere.
  iv. The inside of the chamber is depressurized, and the wafer is heated at 100 degrees C. for 30 minutes so as to remove the decomposed residue of the lower solidified film.

(Example 12) Combination of Thermally
Decomposable Polymer and Acid- or
Alkali-Gas-Decomposable Polymer (a) Film Forming Step
  i. A solution of 10 wt % of a gas-decomposable polyester as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a thermally decomposable poly(isobutyl methacrylate) as the second material and THF is spin-coated on the lower solidified film.
  iv. Next, the thin film fabricated in iii is heated at 60 degrees C. for 5 minutes, and the solvent is removed so as to form an upper solidified film.
(b) Material Removal Step
  i. The film-formed wafer is heated at 200 degrees C. for 30 minutes in a depressurized chamber, and the poly (isobutyl methacrylate) film (upper layer solidified film) is removed through thermal decomposition.
  ii. The film-formed wafer is heated at 100 degrees C. for 1 hour in a 50 vol % ammonia atmosphere, and the polyester film (lower solidified film) is decomposed and removed using ammonia gas.
  iii. The atmosphere inside the depressurized chamber is replaced with a 100% $N_2$ atmosphere.
  iv. The inside of the depressurized chamber is depressurized, and the wafer is heated at 100 degrees C. for 30 minutes so as to remove the decomposed residue of the lower solidified film.

(Example 13) Combination of Photodecomposable
Polymer and Acid- or Alkali-Gas-Decomposable
Polymer (a) Film Forming Step
  i. A solution of 10 wt % of a gas-decomposable polyester as the first material and THF is spin-coated on a wafer.
  ii. Next, the thin film fabricated in i is heated at 60 degrees C. for 5 minutes, and the solvent is volatilized so as to form a lower solidified film.

iii. A solution of 10 wt % of a photodecomposable polyketone as the second material and THF is spin-coated on the lower solidified film.
iv. Next, the thin film fabricated in iii is heated at 60 degrees C. for 5 minutes, and the solvent is volatilized so as to form an upper solidified film.

(b) Material Removal Step
  i. The film-formed wafer is irradiated with ultraviolet light (wavelength: 250 to 365 nm) while being heated at 100 degrees C. in a depressurized chamber, and the polyketone film (upper solidified film) is removed through photodecomposition.
  ii. Next, light emission is stopped.
  iii. The film-formed wafer is heated at 100 degrees C. for 1 hour in a 50 vol % ammonia atmosphere, and the polyester film (lower solidified film) is decomposed and removed using ammonia gas.
  iv. The atmosphere inside the depressurized chamber is replaced with a 100% $N_2$ atmosphere.
  v. The inside of the chamber is depressurized, and the wafer is heated at 100 degrees C. for 30 minutes so as to remove the decomposed residue of the lower solidified film.

(Example 14) Combination of Acid- or Alkali-Gas-Decomposable Polymer and Acid- or Alkali-Gas-Decomposable Polymer (a) Film Forming Step
  i. A solution of 10 wt % of a gas-decomposable polyester as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a gas-decomposable polyazomethine as the second material and THF is spin-coated on the lower solidified film.
  iv. Next, the thin film fabricated in iii is heated at 60 degrees C. for 5 minutes, and the solvent is volatilized so as to form an upper solidified film.

(b) Material Removal Step
  i. The film-formed wafer is heated at 100 degrees C. for 1 hour in a 50 vol % hydrochloride atmosphere, and the polyazomethine film (upper solidified film) is decomposed and removed by acidic gas.
  ii. The atmosphere inside the depressurized chamber is replaced with a 100% $N_2$ atmosphere.
  iii. The inside of the depressurized chamber is depressurized, and the wafer is heated at 100 degrees C. for 30 minutes so as to remove the decomposed residue of the upper solidified film.
  iv. The wafer is heated at 100 degrees C. for 1 hour in a 50 vol % ammonia atmosphere, and the polyester film (lower solidified film) is decomposed and removed using ammonia gas.
  v. The atmosphere inside the depressurized chamber is replaced with a 100% $N_2$ atmosphere.
  vi. The inside of the depressurized chamber is depressurized, and the wafer is heated at 100 degrees C. for 30 minutes so as to remove the decomposed residue of the lower solidified film.

(Example 15) Combination of Ozone-Decomposable Polymer and Acid- or Alkali-Gas-Decomposable Polymer (a) Film Forming Step
  i. A solution of 10 wt % of a gas-decomposable polyester as the first material and THF is spin-coated on a wafer.
  ii. Next, the thin film fabricated in i is heated at 60 degrees C. for 5 minutes, and the solvent is volatilized so as to form a lower solidified film.
  iii. A solution of 10 wt % of a gas-decomposable resist polymer as the second material and PGMEA is spin-coated on the lower solidified film.
  iv. Next, the thin film fabricated in iii is heated at 60 degrees C. for 5 minutes, and the solvent is volatilized so as to form an upper solidified film.

(b) Material Removal Step
  i. The film-formed wafer is heated at 100 degrees C. for 2 hours in a 50 vol % ozone atmosphere, and the resist polymer film (upper solidified film) is decomposed and removed using ozone gas.
  ii. The atmosphere inside the depressurized chamber is replaced with a 100% $N_2$ atmosphere.
  iii. The wafer is heated at 100 degrees C. for 1 hour in a 50 vol % ammonia atmosphere, and the polyester film (lower solidified film) is decomposed and removed using ammonia gas.
  iv. The atmosphere inside the depressurized chamber is replaced with a 100% $N_2$ atmosphere.
  v. The inside of the depressurized chamber is depressurized, and the wafer is heated at 100 degrees C. for 30 minutes so as to remove the decomposed residue of the lower solidified film.

(Example 16) Combination of Sublimable Polymer and Ozone-Decomposable Polymer (a) Film Forming Step
  i. A solution of 10 wt % of a gas-decomposable resist polymer as the first material and PGMEA is spin-coated on a wafer.
  ii. Next, the thin film fabricated in i is heated at 60 degrees C. for 5 minutes, and the solvent is volatilized so as to form a lower solidified film.
  iii. A solution of 10 wt % of a sublimable anthracene as the second material and IPA is spin-coated on the lower solidified film and is naturally dried so as to form an upper solidified film.

(b) Material Removal Step
  i. The film-formed wafer is heated at 100 degrees C. for 30 minutes in a depressurized chamber, and the anthracene film (upper solidified film) is removed through sublimation.
  ii. The wafer is heated at 100 degrees C. for 2 hours in a 50 vol % ozone atmosphere, and the resist polymer film (lower solidified film) is decomposed and removed using ozone gas.

(Example 17) Combination of Thermally Decomposable Polymer and Ozone-Decomposable Polymer (a) Film Forming Step
  i. A solution of 10 wt % of a gas-decomposable resist polymer as the first material and PGMEA is spin-coated on a wafer.

ii. Next, the thin film fabricated in i is heated at 60 degrees C. for 5 minutes, and the solvent is volatilized so as to form a lower solidified film.
iii. A solution of 10 wt % of a thermally decomposable poly(isobutyl methacrylate) as the second material and THF is spin-coated on the lower solidified film.
iv. Next, the thin film fabricated in iii is heated at 60 degrees C. for 5 minutes, and the solvent is volatilized so as to form an upper solidified film.

(b) Material Removal Step
i. The film-formed wafer is heated at 200 degrees C. for 30 minutes in a depressurized chamber, and the poly(isobutyl methacrylate) film (upper solidified film) is removed through thermal decomposition.
ii. The wafer is heated at 100 degrees C. for 2 hours in a 50 vol % ozone atmosphere, and the resist polymer film (lower solidified film) is decomposed and removed using ozone gas.

(Example 18) Combination of Photodecomposable Polymer and Ozone-Decomposable Polymer (a) Film Forming Step
i. A solution of 10 wt % of a gas-decomposable resist polymer as the first material and PGMEA is spin-coated on a wafer.
ii. Next, the thin film fabricated in i is heated at 60 degrees C. for 5 minutes, and the solvent is volatilized so as to form a lower solidified film.
iii. A solution of 10 wt % of a photodecomposable polyketone as the second material and THF is spin-coated on the lower solidified film.
iv. Next, the thin film fabricated in iii is heated at 60 degrees C. for 5 minutes, and the solvent is removed so as to form an upper solidified film.

(b) Material Removal Step
i. The film-formed wafer is irradiated with ultraviolet light (wavelength: 250 to 365 nm) while being heated at 100 degrees C. in a depressurized chamber, and the polyketone film (upper solidified film) is removed through photodecomposition.
ii. Next, light emission is stopped.
iii. The wafer is heated at 100 degrees C. for 2 hours in a 50 vol % ozone atmosphere, and the resist polymer film (lower solidified film) is decomposed and removed using ozone gas.

(Example 19) Combination of Acid- or Alkali-Gas-Decomposable Polymer and Ozone-Decomposable Polymer (a) Film Forming Step
i. A solution of 10 wt % of a gas-decomposable resist polymer as the first material and PGMEA is spin-coated on a wafer.
ii. Next, the thin film fabricated in i is heated at 60 degrees C. for 5 minutes, and the solvent is volatilized so as to form a lower solidified film.
iii. A solution of 10 wt % of a gas-decomposable polyester as the second material and THF is spin-coated on the lower solidified film.
iv. Next, the thin film fabricated in iii is heated at 60 degrees C. for 5 minutes, and the solvent is removed so as to form an upper solidified film.

(b) Material Removal Step
i. The wafer is heated at 100 degrees C. for 1 hour in a 50 vol % ammonia atmosphere, and the polyester film (upper solidified film) is decomposed and removed using ammonia gas.
ii. The atmosphere inside the depressurized chamber is replaced with a 100% $N_2$ atmosphere.
iii. The inside of the depressurized chamber is depressurized, and the wafer is heated at 100 degrees C. for 30 minutes so as to remove the decomposed residue.
iv. The wafer is heated at 100 degrees C. for 2 hours in a 50 vol % ozone atmosphere, and the resist polymer film (lower solidified film) is decomposed and removed using ozone gas.

(Example 20) Combination of Ozone-Decomposable Polymer and Ozone-Decomposable Polymer Example 20 has the same configuration and acting effect as those of the above-described example, and a detailed description thereof is omitted here.

In the examples described above, an example in which the solution concentration of the first material or the second material in the solution is 10 wt % has been illustrated, but the present disclosure is not limited thereto. The solution concentration of the first material or the second material in the solution may be adjusted in the range of 1 to 30 wt %.

In addition, in the examples described above, an example in which tetrahydrofuran (THF) is used as the solvent in the solution has been illustrated, but the present disclosure is not limited thereto. As the solvent, ethanol, isopropyl alcohol, acetone, toluene, 2-methoxy-1-methylethyl acetate (PM thinner), cyclohexane, or cyclohexanone may be used.

EXPLANATION OF REFERENCE NUMERALS

W: substrate (semiconductor wafer), 11: spin chuck, 22, 22*a*, 22*b*, 22*c*: rinsing liquid feeder, 24, 24*a*, 24*b*, 24*c*: $N_2$ gas feeder, 30, 30*a*, 30*b*, 30*c*, 31, 32, 34: material solution feeder, 41S: first material in solid state, 41L: solution of first material, 42S: second material in solid state, 42L: solution of second material, 60: material removal unit, 61: hot plate, 62: resistance heater, 63: holding pin, 64: processing container, 65: exhaust pipe, 66: valve, 67: pump, 68: material recovery device, 71: $N_2$ gas supply source, 72: alkaline gas supply source, 73: acidic gas supply source, 75: light source, 100: pattern, 101: convex portion of pattern, 102: concave portion of pattern

What is claimed is:
1. A substrate processing method for removing liquid on a substrate having an uneven pattern formed on a surface of the substrate and drying the substrate, the substrate processing method comprising:
forming a laminate having a two-layer structure including a first material in a solid state forming a lower layer and a second material in a solid state forming an upper layer, in a concave portion of the pattern;
removing the second material from the concave portion by performing any one of a first heating process, a first reaction process using a first gas, and a first light-emitting process, wherein said first heating process uses sublimation to remove the second material, wherein said first reaction process uses a gas reaction to remove the second material, and wherein said first light-emitting process uses decomposition to remove the second material; and removing the first material from the concave portion by performing any one of a second heating process, a second reaction process using a second gas, and a second light-emitting process, wherein said second heating process uses sublimation to remove the first material, wherein said second reaction process uses a gas reaction to remove the first material, and wherein said second light-emitting process uses decomposition to remove the first material, wherein the forming the laminate in the concave portion includes:
forming the first material in the solid state by supplying a first solution including the first material and a first solvent to fill the pattern with the first solution and then drying the first solvent in the first solution; and
forming the second material in the solid state by supplying a second solution including the second material and a second solvent on the first material to fill the pattern with the second solution and then drying the second solvent in the second solution.

2. The substrate processing method of claim 1, wherein the second material is made of a sublimable material, and
the sublimable material is removed from the concave portion through sublimation by heating the second material to a temperature higher than a sublimation temperature of the second material.

3. The substrate processing method of claim 2, wherein the first material is made of a thermally decomposable polymer material, and
the thermally decomposable polymer material is removed from the concave portion by heating and thermally decomposing the thermally decomposable polymer material.

4. The substrate processing method of claim 2, wherein the first material is made of a photodecomposable polymer material, and
the photodecomposable polymer material is removed from the concave portion by irradiating the photodecomposable polymer material with light.

5. The substrate processing method of claim 2, wherein the first material is made of a gas-decomposable polymer material which is decomposable by an acidic gas or an alkaline gas, and
the gas-decomposable polymer material is removed from the concave portion by performing a gas reaction process using the acidic gas or the alkaline gas with respect to the gas-decomposable polymer material.

6. The substrate processing method of claim 2, wherein the first material is made of an ozone-gas-decomposable polymer material which is decomposable by ozone gas, and
the ozone-gas-decomposable polymer material is removed from the concave portion by performing a gas reaction process using the ozone gas with respect to the ozone-gas-decomposable polymer material.

7. The substrate processing method of claim 2, wherein, prior to the forming the laminate in the concave portion, rinsing is performed to supply a rinsing liquid to the substrate, and the rinsing liquid on the substrate is replaced with at least a solution of the first material.

8. The substrate processing method of claim 1, wherein the first material is made of a thermally decomposable polymer material, and
the thermally decomposable polymer material is removed from the concave portion by heating and thermally decomposing the thermally decomposable polymer material.

9. The substrate processing method of claim 1, wherein the first material is made of a photodecomposable polymer material, and
the photodecomposable polymer material is removed from the concave portion by irradiating the photodecomposable polymer material with light.

10. The substrate processing method of claim 1, wherein the first material is made of a gas-decomposable polymer material which is decomposable by an acidic gas or an alkaline gas, and
the gas-decomposable polymer material is removed from the concave portion by performing a gas reaction process using the acidic gas or the alkaline gas with respect to the gas-decomposable polymer material.

11. The substrate processing method of claim 1, wherein the first material is made of an ozone-gas-decomposable polymer material which is decomposable by ozone gas, and
the ozone-gas-decomposable polymer material is removed from the concave portion by performing a gas reaction process using the ozone gas with respect to the ozone-gas-decomposable polymer material.

12. The substrate processing method of claim 1, wherein, prior to the forming the laminate in the concave portion, rinsing is performed to supply a rinsing liquid to the substrate, and the rinsing liquid on the substrate is replaced with at least a solution of the first material.

13. A substrate processing method for removing liquid on a substrate having an uneven pattern formed on a surface of the substrate and drying the substrate, the substrate processing method comprising:
forming a laminate having a two-layer structure including a first material in a solid state forming a lower layer and a second material in a solid state forming an upper layer, in a concave portion of the pattern;
removing the second material from the concave portion by performing any one of a first heating process, a first reaction process using a first gas, and a first light-emitting process, wherein said first heating process uses sublimation to remove the second material, wherein said first reaction process uses a gas reaction to remove the second material, and wherein said first light-emitting process uses decomposition to remove the second material; and
removing the first material from the concave portion by performing any one of a second heating process, a second reaction process using a second gas, and a second light-emitting process, wherein said second heating process uses sublimation to remove the first material, wherein said second reaction process uses a gas reaction to remove the first material, and wherein said second light-emitting process uses decomposition to remove the first material,
wherein the forming the laminate in the concave portion includes:
supplying a solution containing the first material, the second material, and a solvent so as to fill the pattern with the solution;
separating the solution into a first solution containing the first material of the lower layer and a second solution containing the second material of the upper layer using a difference in specific gravity; and
after the separating of the solution, drying the solvent in the first solution and the second solution so as to form the laminate including the first material and the second material in the solid state.

* * * * *